United States Patent
Yamazaki et al.

(10) Patent No.: US 9,187,311 B2
(45) Date of Patent: Nov. 17, 2015

(54) MEMS DEVICE AND METHOD OF MANUFACTURING THE SAME

(71) Applicant: KABUSHIKI KAISHA TOSHIBA, Minato-ku, Tokyo (JP)

(72) Inventors: Hiroaki Yamazaki, Yokohama (JP); Haruka Kubo, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 6 days.

(21) Appl. No.: 13/966,175

(22) Filed: Aug. 13, 2013

(65) Prior Publication Data

US 2014/0284188 A1 Sep. 25, 2014

(30) Foreign Application Priority Data

Mar. 25, 2013 (JP) .................. 2013-061857

(51) Int. Cl.
*H01H 57/00* (2006.01)
*B81B 3/00* (2006.01)
*H01G 5/18* (2006.01)
*H01H 59/00* (2006.01)

(52) U.S. Cl.
CPC .............. *B81B 3/0086* (2013.01); *H01G 5/18* (2013.01); *B81B 2201/016* (2013.01); *H01H 59/0009* (2013.01)

(58) Field of Classification Search
CPC ........... H01H 57/00; H01H 1/00; H01H 1/02; H01H 1/06; H01H 1/22; H01H 2001/00; H01H 2001/0036; H01H 2001/0052; H01H 2001/0078; H01H 2001/0084; H01H 2037/00; H01H 2037/008; H01H 2037/52; H01H 2037/525; H01H 2037/526; H01H 2037/54; H01H 2037/64; H01H 2037/549; H01H 2205/00; H01H 2205/004

USPC ......................................................... 200/181
See application file for complete search history.

(56) References Cited

U.S. PATENT DOCUMENTS 6,717,496 B2 * 4/2004 Feng et al. .................. 335/78
8,445,976 B2 * 5/2013 Yamazaki .................. 257/415
(Continued)

FOREIGN PATENT DOCUMENTS

| CN | 101993030 A | 3/2011 |
| JP | 2006-231489 A | 9/2006 |

(Continued)

OTHER PUBLICATIONS

Taiwanese Office Action, dated Oct. 16, 2014, issued in counterpart Taiwanese application No. 102129285.

(Continued)

*Primary Examiner* — Edwin A. Leon
*Assistant Examiner* — Anthony R. Jimenez
(74) *Attorney, Agent, or Firm* — Holtz, Holtz, Goodman & Chick PC (57) ABSTRACT

According to one embodiment, a MEMS device comprises a first electrode provided on a support substrate, a second electrode opposed to the first electrode and movable in the direction it is opposed to the first electrode, and beam parts, each connected to those sides of the second electrode, which oppose to each other, and each supporting the second electrode. The second electrode has a slit extending parallel to the sides to which the beam parts are connected and opening at both the front and the back. Further, the second electrode has at least one bridge part extending over the slit, crossing the slit and made of a material different from that of the second electrode.

21 Claims, 9 Drawing Sheets

(56) References Cited

U.S. PATENT DOCUMENTS

| | | | |
|---|---|---|---|
| 8,569,091 B2* | 10/2013 | Anderson et al. | 438/52 |
| 2011/0063774 A1 | 3/2011 | Ikehashi et al. | |
| 2012/0235537 A1 | 9/2012 | Masunaga et al. | |

FOREIGN PATENT DOCUMENTS

| JP | 2012-151071 A | 8/2012 |
|---|---|---|
| JP | 2012-183612 A | 9/2012 |
| JP | 2012196041 A | 10/2012 |
| TW | 201121876 A | 7/2011 |

OTHER PUBLICATIONS

Japanese Office Action (and English translation thereof) dated Jun. 2, 2015, issued in counterpart Japanese Application No. 2013-061857.

* cited by examiner

MEMS DEVICE AND METHOD OF MANUFACTURING THE SAME

CROSS-REFERENCE TO RELATED APPLICATIONS

This application is based upon and claims the benefit of priority from Japanese Patent Application No. 2013-061857, filed Mar. 25, 2013, the entire contents of which are incorporated herein by reference.

FIELD

Embodiments described herein relate generally to a microelectromechanical system (MEMS) device and a method of manufacturing the same.

BACKGROUND

The high-frequency MEMS element having variable capacity has a smaller signal loss and higher linearity than the conventional semiconductor element. It is therefore expected that the high-frequency MEMS element should be incorporated in next-generation wireless systems. In any wireless system of this type, so-called "hot switching" should be performed to switch the elements while high-frequency signals are passing through the elements.

In the hot switching performed in the MEMS element, the self-actuation and self-holding of the MEMS element become problems. To avoid the self-actuation, it suffices to set the pull-in voltage higher than the DC bias made effective by the high-frequency signal. That is, the self-actuation can be prevented in the MEMS device of the ordinary design. By contrast, to avoid the self-holding, the pull-out voltage need be higher than the DC bias made effective by the high-frequency signal. Inevitably, it is difficult to prevent the self-holding in the MEMS of the ordinary design.

DETAILED DESCRIPTION

In general, according to one embodiment, a MEMS device comprises a first electrode provided on a support substrate; a second electrode opposed to the first electrode and movable in the direction it is opposed to the first electrode; and beam parts, each connected to those sides of the second electrode, which oppose to each other, and each supporting the second electrode. The second electrode has a slit extending parallel to the sides to which the beam parts are connected and opening at both the front and the back. Further, the second electrode has at least one bridge part extending over the slit, crossing the slit and made of a material different from that of the second electrode.

Before the embodiment is described, the fundamental configuration and operating principle of the MEMS device will be explained.

Figure 1A:
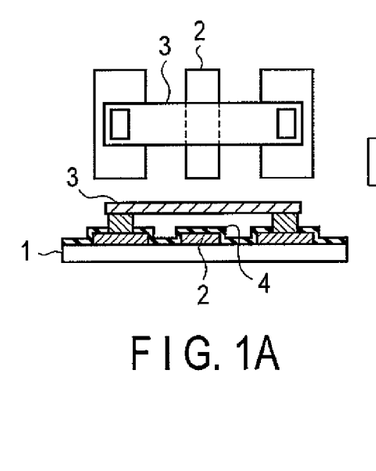
FIGS. 1A and 1B are diagrams explaining the fundamental configuration and operating principle of a MEMS device.
Figure 1B:
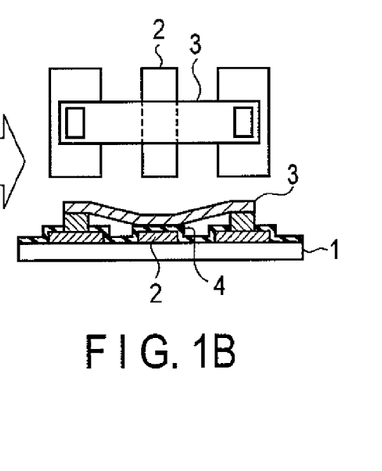

As shown in FIGS. 1A and 1B, the MEMS device comprises a lower electrode 2 secured to a substrate 1, and an upper electrode 3 provided on the lower substrate 2 and able to move. A drive voltage (DC voltage) is applied between electrodes 2 and 3, generating an electrostatic force. The electrostatic force moves the upper electrode 3, contacting the same to, or away from, the lower electrode 2. In FIGS. 1A and 1B, number 4 designates a capacitor insulating film. The upper electrode 3 is supported at both ends by a beam part (spring part), which is not shown in FIGS. 1A and 1B.

Figure 2:
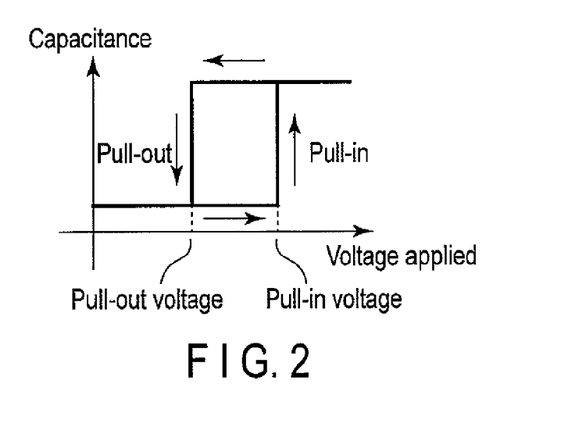
FIG. 2 is a characteristic diagram showing the hysteresis between the pull-in voltage and pull-out voltage, which is observed in the MEMS device.

As shown in FIG. 2, the MEMS device has hysteresis in the pull-in voltage causing the upper electrode 3 and the lower electrode 2 to contact, and in the pull-out voltage causing electrodes 2 and 3 to move away from each other. That is, the pull-in voltage is higher than the pull-out voltage.

As described in Background, the hot switching performed in the MEMS device creates the following problem. Any high-frequency signal has, in effect, a DC bias, and generates an electrostatic force. Therefore, the hot switching performed in the MEMS device is switching that undergoes while the electrostatic force is acting, in effect, because of the high-frequency signal. Here arise two problems, i.e., self-actuation and self-holding.

While being off, the MEMS device assumes an up state, with electrodes 2 and 3 not contacting as shown in FIG. 1A. At this point, an effective electrostatic force pulls the upper electrode 3, forcedly turning the MEMS device on, or setting the MEMS device to the down state, as shown in FIG. 1B. This is the self-actuation.

While being on, the MEMS device assumes a down state, with electrodes 2 and 3 contacting as shown in FIG. 1B, with the insulating film 4 interposed between them. An electrostatic force generated from a high-frequency signal keeps electrodes 2 and 3 in contact, even when a drive signal supplied to the MEMS device switch the same from the down state to the up state. This is the self-holding.

To prevent the self-actuation, the pull-in voltage for switching the MEMS device from the up state to the down state needs only to have a value greater than the effective DC bias made effective by the high-frequency signal. Therefore, the self-actuation is comparatively easy to prevent in any MEMS of the ordinary design. In GSM (trademark), i.e., a wireless system, for example, the effective electrostatic pull is equivalent to 13V if a high-frequency power of 3 W at most is supplied and if the characteristic impedance is 50Ω. It is relatively easy to set the pull-in voltage to 13 V or more in any MEMS device of the ordinary design.

To prevent the self-holding, the pull-out voltage (i.e., pulling-up voltage) for switching the MEMS device from the down state to the up state needs to have a value greater than the effective DC bias made effective by the high-frequency signal. If the spring part is made strong to raise the pull-out voltage, however, the pull-in voltage will rise even more.

Hitherto, a structure for raising the pull-out voltage has been proposed. In this structure, the upper electrode of the MEMS device has a slit. This structure can raise the pull-out voltage, because the slit extends in the lengthwise direction of the upper electrode (namely, parallel to the sides to which the spring is connected). That is, the structure can decrease the hysteresis between the pull-in voltage and pull-out voltage. Once the element has been manufactured, however, the upper electrode undergoes so-called "V-deformation, assuming a V-shape. Inevitably, the element fails to exhibit the characteristics expected of it.

The V-deformation results as the sacrificial layer (later described) shrinks while being cured. The upper-electrode structure, which has a slit, has small mechanical rigidity. The V-deformation is therefore considered resulting from the force exerted on the upper electrode structure. Consequently, it is difficult to realize a structure with a slit.

The embodiment is designed to suppress the V-deformation resulting from the slit made, thus not only taking measures against the V-deformation, but also achieving high tolerance to the hot switching.

MEMS devices according to some embodiments will be described below, with reference to the drawings.

First Embodiment

Figure 3:
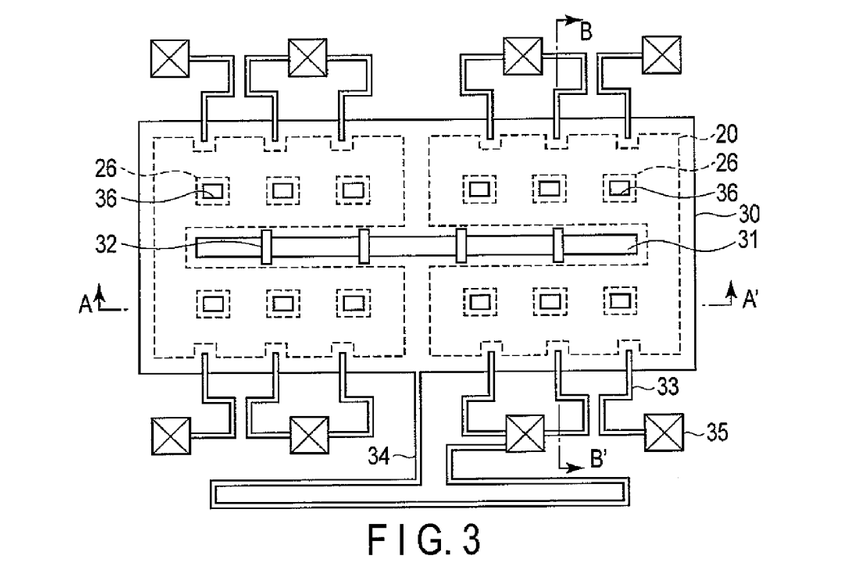
FIG. 3 is a plan view schematically showing the configuration of a MEMS device according to a first embodiment.
Figure 4A:
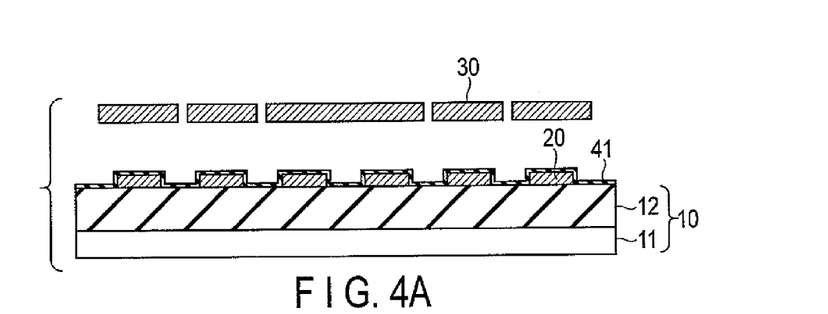
FIGS. 4A and 4B are sectional views, respectively taken along line A-A' and line B-B' shown in FIG. 3.
Figure 4B:
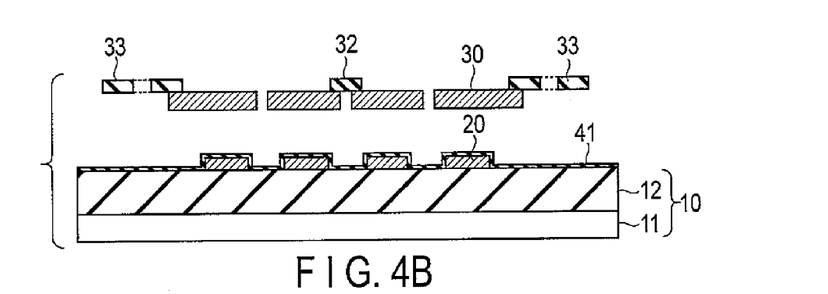

FIG. 3, FIG. 4A and FIG. 4B explain a MEMS device according to a first embodiment. FIG. 3 is a plan view schematically showing the configuration of the MEMS device. FIG. 4A is a sectional view, taken along line A-A' shown in FIG. 3. FIG. 4B is a sectional view, taken respectively line B-B' shown in FIG. 3.

In FIGS. 4A and 4B, number 10 designates a support substrate, which comprises a silicon (Si) substrate 11 and an insulating film 12 made of, for example, silicon oxide (SiO2) and formed on the silicon substrate 11. The support substrate 10 may incorporate elements, such as field-effect transistors constituting a logic circuit and a memory circuit.

On the support substrate 10, a lower electrode (first electrode) 20 is provided and used as fixed electrode. The lower electrode 20 is made of, for example, aluminum (Al) or an Al alloy, and split into a plurality of parts (for example, two parts, or left and right parts). The lower electrode 20 is connected to a wire (not shown) that is made of the same material as the lower electrode 20, and further to various circuits. The material of the lower electrode 20 is not limited to Al or an Al alloy. The lower electrode 20 may be made of copper (Cu), gold (Au), platinum (Pt) or the like.

A capacitor insulating film 41 made of, for example, silicon nitride (SiN) is formed, covering the surface of the lower electrode 20. The material of the capacitor insulating film 41 is not limited to silicon nitride. The capacitor insulating film 41 may be a High-k film instead, which had a larger dielectric constant than SiOx and SiN.

Above the lower electrode 20, an upper electrode (second electrode) 30 is arranged, facing the lower electrode 20. The upper electrode 30 is rectangular and larger than the lower electrode 20, and is formed, overlaps the lower electrode 20. Thus, the ends of the upper electrode 30 lie outside the ends of the lower electrode 20. The upper electrode 30 is made of, for example, a ductile material such as Al, an Al alloy, Cu, Au or Pt. A member made of any ductile material undergoes plastic deformation before it is fractured by stress. The material of the upper electrode 30 is not limited to a ductile material, nevertheless. The upper electrode 30 may be made of a brittle material such as tungsten (W).

The upper electrode 30 is secured by first spring parts (beam parts) 33 to anchor parts 35 provided on the support substrate 10, at two sides that oppose each other in the lengthwise direction of the upper electrode 30. The first spring parts 33 are, for example, silicon nitride films, have meandering shape, and has elasticity. The first spring parts 33 enable the upper electrode 30 to move up and down. The lower electrode 20 has notches at such positions that no parts of the lower electrode 20 may exist below the junctions of the upper electrode 30 and the first spring parts 33 or beneath these junctions. This avoids the influence of the deformation the upper electrode 30 undergoes at the junctions with the first spring parts 33. Nonetheless, the lower electrode 20 need not have notches by all means.

The first spring parts 33 are made of a brittle material. A member made of any brittle material scarcely undergoes plastic deformation (change of shape) before it is fractured by stress.

The material of the first spring parts 33 is not limited to silicon nitride film. The first spring parts 33 may be silicon oxide films instead. Further, the first spring parts 33 may be made of an electrically conductive material such as poly-Si, Si, molybdenum (Mo) or an aluminum-titanium (Al—Ti) alloy. The Al—Ti alloy may contain another element. In short, the material of the first spring parts 33 is not limited to a brittle one, and may be a ductile material instead.

The upper electrode 30 is connected, at one part, to an anchor part 35 provided on the substrate 10, by a second spring part 34 made of an electrically conductive material. The second spring part 34 achieves electrical conduction with the upper electrode 30, and is made of an electrically conductive, ductile material identical to the material of the upper electrode 30. More specifically, the second spring part 34 is made of, for example, Al, an alloy made mainly of Al, or a metal such as Cu, Au or Pt. The anchor parts 35 are, for example, electrical conductors and are made of the same material as the second spring part 34.

A dome layer (not shown) may be provided, covering the space in which the upper electrode 30, spring parts 33 and spring part 34 can move. The lower electrode 20 is split into the left and right parts in order to improve the high-frequency characteristic of the MEMS device. The lower electrode 20 need not be so split by all means, nevertheless. Moreover, the second spring part 34 may be secured to an anchor part (not shown) different from the anchor parts 35, not to one anchor part 35 as described above.

Described thus far is the fundamental configuration of this embodiment. In addition to the features described above, the upper electrode 30 has a slit 31 and bridge parts 32. More precisely, the upper electrode 30 has a slit 31 extending parallel to the two sides to which the spring parts 33 are connected and which extend in the lengthwise direction of the upper electrode 30. Slit 31 opens at the upper and lower surfaces of the upper electrode 30, at the center part of the upper electrode 30. Bridge parts 32 (for example, four parts)

are provided on the upper electrode 30, each crossing slit 31 and extending over slit 31. The bridge parts 32 are made of a brittle material, and are insulating films made of, for example, silicon nitride. Each bridge part 32 is secured to the upper electrode 30, at the lower surface of either end.

The center part of the upper electrode 30 is more spaced from the spring parts 33 arranged at both sides than any other part of the upper electrode 30, and receives smaller force from the spring parts 33 while being pulled out. If the center part is attracted toward the lower electrode 20, the upper electrode 30 can hardly be pulled out. Since the upper electrode 30 has a slit 31 in the center part, however, the center part is not attracted. The pull-out voltage can therefore be raised.

The bridge parts 32 so provided enhances the rigidity of that part of the upper electrode 30, which has slit 31 and has but low rigidity. This helps suppress the V-deformation of that part of the upper electrode 30. Having the bridge parts 32 so provided at slit 31, the MEMS device is configured to suppress the V-deformation of the upper electrode 30.

The upper electrode 30 has holes 36 between slit 31 and those ends of the spring parts 33, which are connected to the upper electrode 30. Similarly, the lower electrode 20 has holes 26 aligned with the holes 36, respectively. The holes 36 of the upper electrode 30 have a smaller diameter than the holes 26 of the lower electrode 20. The upper electrode 30 therefore overlaps the lower electrode 20, also at each part having the hole 36. The holes 36 of the upper electrode 30 are used to remove the sacrificial layer existing beneath the upper electrode 30. However, the upper electrode 30 need not have the holes 36 since the sacrificial layer can be removed through slit 31. Further, the lower electrode 20 may not have holes 26.

The process flow of manufacturing this structure will be explained with reference to FIG. 5A to 5H. FIG. 5A to 5H are sectional views taken along line B-B' shown in FIG. 3. In these figures, only one of the electrode halves separated the slit is illustrated, for simplicity of explanation.

Figure 5A:
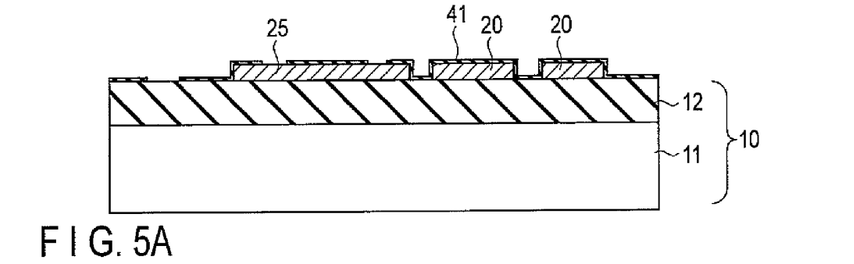
FIGS. 5A to 5H are sectional views illustrating a method of manufacturing the MEMS device of FIG. 3.

First, as shown in FIG. 5A, a layer of electrode material (for example, an Al alloy) is formed on the entire surface of the support substrate 10 comprising an Si substrate 11 and a silicon oxide film 12 formed on the Si substrate 11. Then, the electrode material layer is patterned, thereby forming a lower electrode 20 for a capacitor and an electrode 25 for anchor parts. A capacitor insulating film 41 made of silicon nitride or the like is formed, covering electrodes 20 and 25. Holes are then made in the capacitor insulating film 41. The holes are necessary to form anchor parts and a thin-film dome, which will be described later.

Figure 5B:
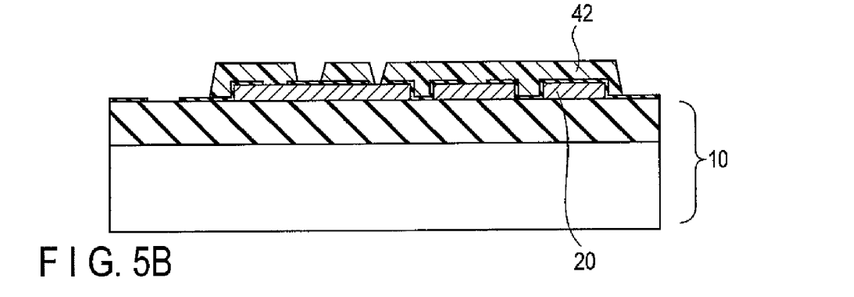

Next, an organic material such as polyimide is applied to the entire surface of the structure, thereby forming a first sacrificial layer 42 as shown in FIG. 5B. The first sacrificial layer 42 is patterned, leaving those parts which will be removed to provide spaces between the upper and lower electrodes.

Figure 5C:
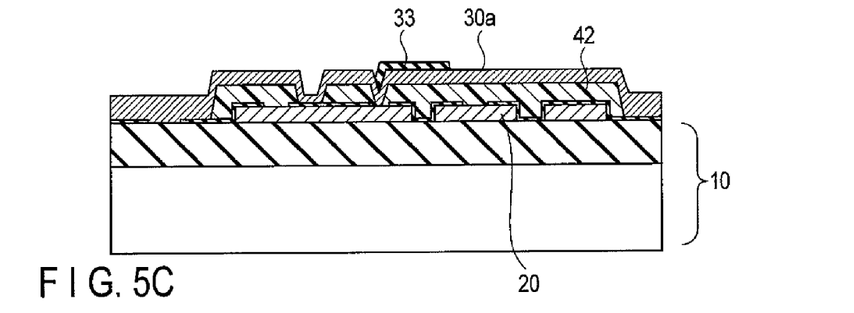

As shown in FIG. 5C, an Al alloy, for example, is deposited, forming an electrically conductive film 30a, which will be processed into an upper electrode. First spring parts 33 made of silicon nitride are formed to connect those parts of the film 30a, which will be anchor parts and the upper electrode. As the first spring parts 33 are formed, bridge parts 32 are formed, using silicon nitride, i.e., the same material as the first spring parts 33.

Figure 5D:
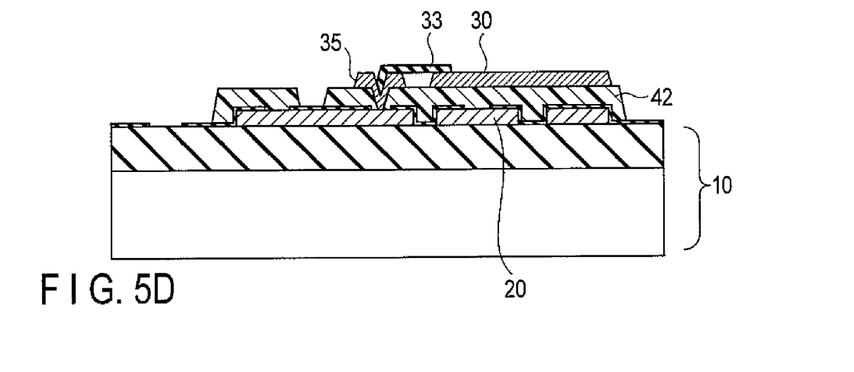

As shown in FIG. 5D, the electrically conductive film 30a is patterned, thereby forming an upper electrode 30 and anchor parts 35.

Figure 5E:
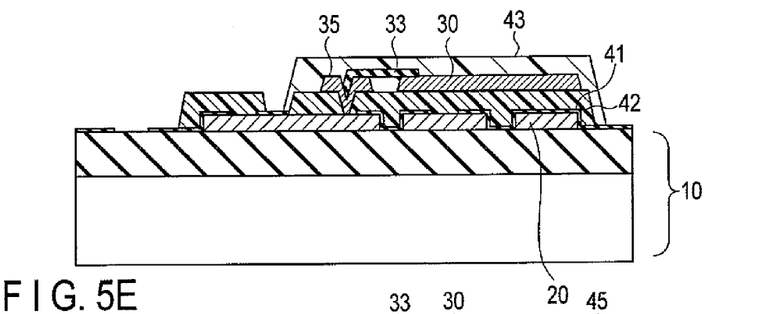

Next, an organic material such as polyimide is applied to the entire surface of the structure, thereby forming a second sacrificial layer 43 as shown in FIG. 5E. The second sacrificial layer 43 is patterned, leaving those parts which will be removed to provide spaces above the upper electrode 30 and the first spring parts 33.

Figure 5F:
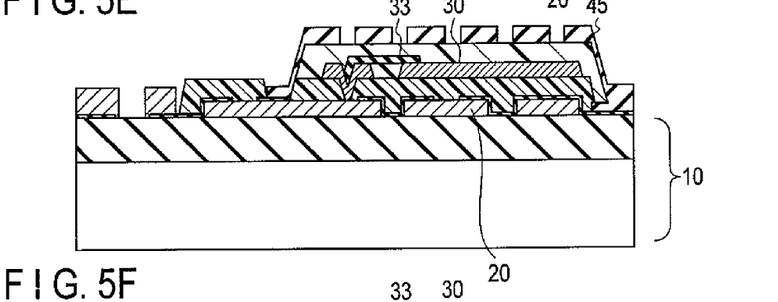

Next, as shown in FIG. 5F, a protective film 45 such as a silicon oxide film is formed. The protective film 45 is patterned, leaving only those parts that cover the upper electrode 30 and first spring parts 33, and making holes in the protective film 45. These holes will be used to remove the second sacrificial layer 43.

Figure 5G:
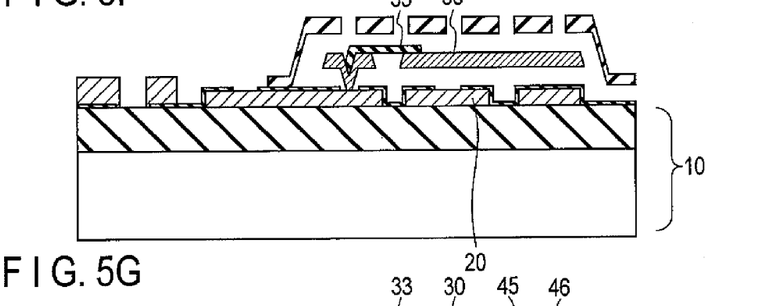

Further, as shown in FIG. 5G, the first sacrificial layer 42 and second sacrificial layer 43 are removed. This enables the upper electrode 30 and spring parts 44 to move up and down.

Figure 5H:
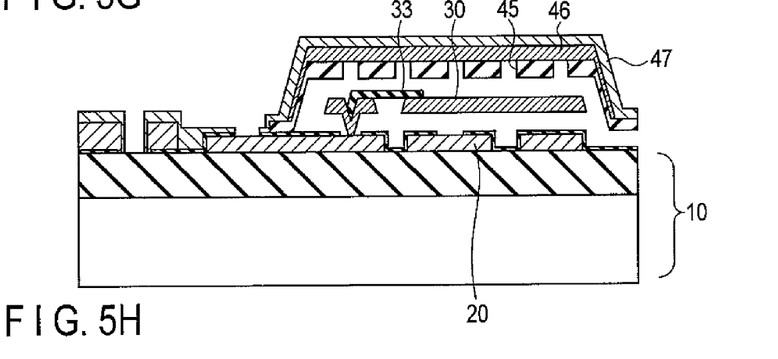

Then, as shown in FIG. 5H, a sealing film 46 is formed and patterned, and a moisture-proof film 47 is formed and patterned. As a result, a thin-film dome is formed, which packages the MEMS section.

Figures 6A, 6B:
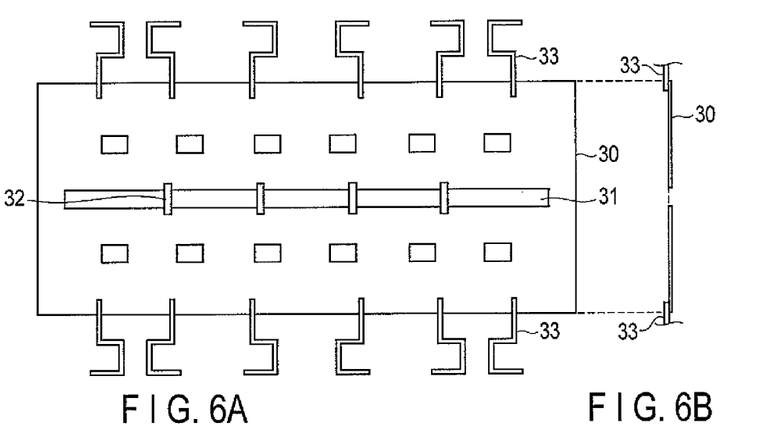
FIGS. 6A and 6B are diagrams schematically showing how the structure deforms into a V-shape in the case where the product has bridges.
Figures 7A, 7B:
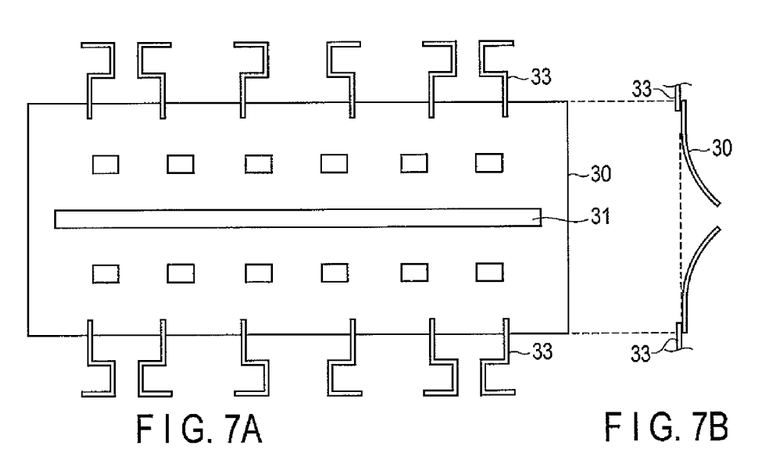
FIGS. 7A and 7B are diagrams schematically showing how the structure deforms into a V-shape in the case where the product has no bridge parts.

In this configuration, the V-deformation greatly depends on whether the bridge parts 32 are provided or not. FIGS. 6A and 6B show a structure having bridge parts 32. FIG. 7A and FIG. 7B show a comparative structure that has no bridge parts 32. Note that FIG. 6A and FIG. 7A are plan views of the upper electrode, and that FIG. 6B and FIG. 7B are sectional views of the upper electrode.

In the device having bridges as shown in FIG. 6A, the bridge parts 32 can enhance the rigidity of that part of the upper electrode 30, which has slit 31. Hence, the V-deformation of the upper electrode 30 is suppressed as shown in FIG. 6B.

In the device having no bridges as shown in FIG. 7A, the V-deformation of the upper electrode 30 is V-deformed as much as shown in FIG. 7B. The device inevitably fails to exhibit characteristics expected of it. That is, if the upper electrode 30 is V-deformed, floating (off), the capacitor capacitance will increase, changing in a narrower range than otherwise.

The upper electrode 30 undergoes V-deformation for the following reason, and the can be suppressed for the following reason. In the process of forming the second sacrificial layer 43, the material is first applied, forming a layer 43, and the layer 43 thus formed is cured. As the layer 43 is cured, it shrinks, applying a stress to the electrode material. Consequently, the electrode material is elastically deformed. When the sacrificial layer 43 is removed, the electrode material regains its initial shape. At this point, a force is applied, pushing the upper electrode 30 at both ends. The upper electrode 30 is V-deformed as shown in FIG. 7B, at the part in which slit 31 is cut. In this embodiment, several bridge parts 32 are provided at slit 31, and enhance the rigidity of that part of electrode 30, which has slit 31. The deformation is thus suppressed.

The first spring parts 33 are floating (free, or not secured to anything), between the upper electrode 30 and the anchor parts 35. The first spring parts 33 horizontally extend in floating state, above the upper surface of the upper electrode 30 and above the edges of the anchor parts 35. That is, the first spring parts 33 lie almost flat, from the upper electrode 30 to the respective anchor parts 35.

So shaped, the first spring parts 33 transmit a stress to the electrode material as the sacrificial layer 43 is cured, and that part of the upper electrode 30, unless the bridge parts 32 are provided. Thus, the bridge parts 32 achieve an advantage so long as the first spring parts 33 are used.

Figure 8:
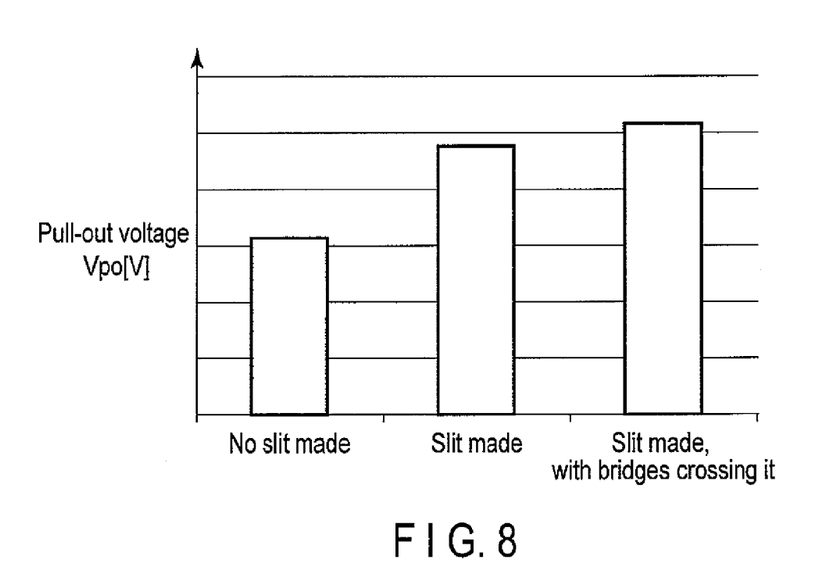
FIG. 8 is a characteristic diagram explaining how the pull-out voltage rises as desired in the first embodiment.

FIG. 8 shows the advantage of this embodiment. More precisely, FIG. 8 shows the pull-out voltages the device has if the upper electrode does not have a slit, the pull-out voltages the device has if the upper electrode has a slit, and pull-out voltages the device has if the upper electrode has a slit and bridge parts 32 cross the slit.

As seen from FIG. 8, the pull-out voltage, which the device has if the upper electrode has a slit or if the upper electrode has a slit and bridge parts 32 cross the slit, is higher than the case where the upper electrode does not have a slit. If the upper electrode has a slit, however, the pull-out voltage will be indeed high, but the V-deformation will be large. If the upper electrode has a and bridge parts 32 cross the slit, not only the pull-out voltage will rise, but also the V-deformation will be suppressed.

As described above, the upper electrode 30 has slit 31 and the bridge parts 32 are provided. The V-deformation of that part of the upper electrode 30, which has slit 31, can therefore be suppressed. The device can therefore generate a high pull-out voltage, while maintaining high tolerance to the hot switching.

The device is further advantageous in the following respect, because the bridge parts 32 are made of silicon nitride film. Made of silicon nitride film, the bridge parts 32 receive a compressive stress, while the upper electrode 30 receives a tensile stress. A force is therefore applied to the upper electrode 30, bending upward, in a convex form, that part of electrode 30, which has slit 31. This force pulls up the upper electrode 30, helping to raise the pull-out voltage.

Second Embodiment

A second embodiment modified in electrode pattern will be described with reference to FIG. 9 to FIG. 14.

Figure 9:
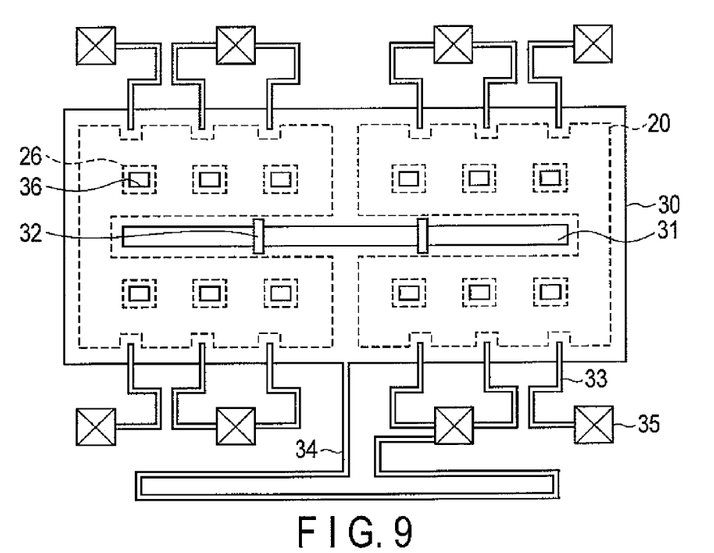
FIG. 9 is a plan view schematically showing the configuration of a MEMS device according to a second embodiment.
Figure 10:
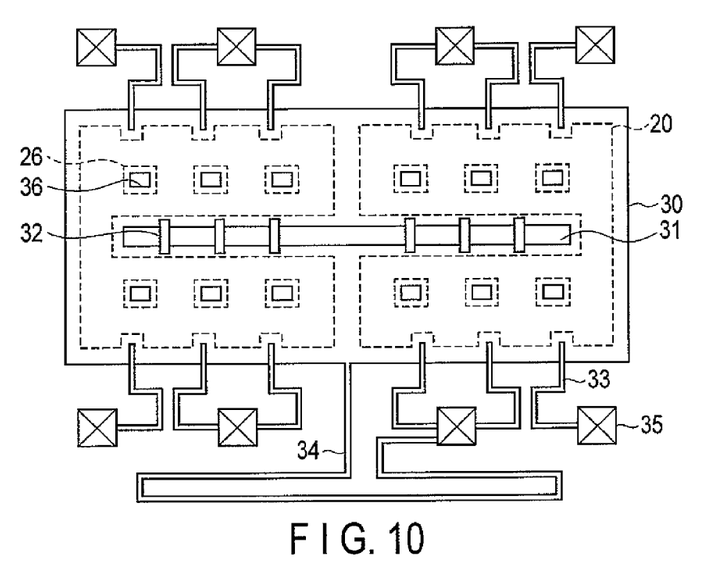
FIG. 10 is another plan view schematically showing the configuration of the MEMS device according to a second embodiment.

The number of bridge parts 32 crossing slit 31 cut in the upper electrode 31 is not limited to four. Rather, two bridge parts may be provided as shown in FIG. 9, or six bridge parts may be provided as shown in FIG. 10. In the device of FIG. 9, the two bridge parts 32 are positioned as if dividing slit 31 into three parts of the same length. In the device of FIG. 10, three bridge parts 32 are positioned above the left half of the lower electrode 20, and the remaining three bridge parts 32 are positioned above the right half of the lower electrode 20. Whichever configuration the device has, it can achieve an advantage similar to that of the first embodiment.

Figure 11:
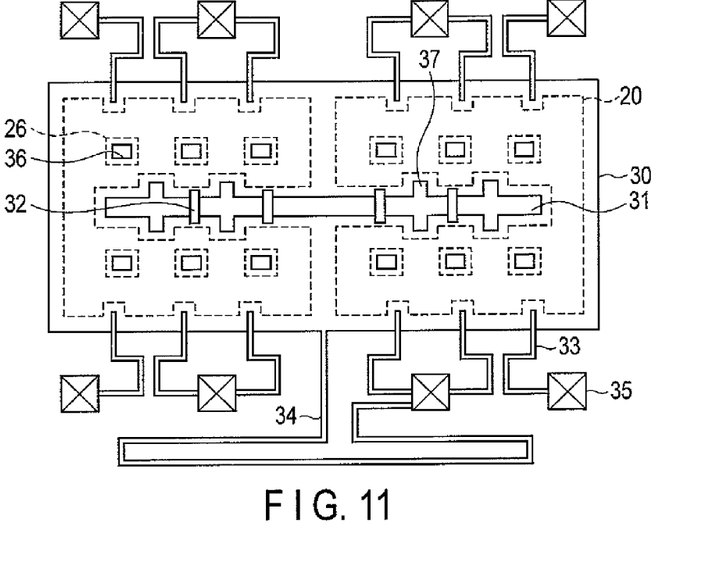
FIG. 11 is still another plan view schematically showing the configuration of the MEMS device according to a second embodiment.
Figure 12:
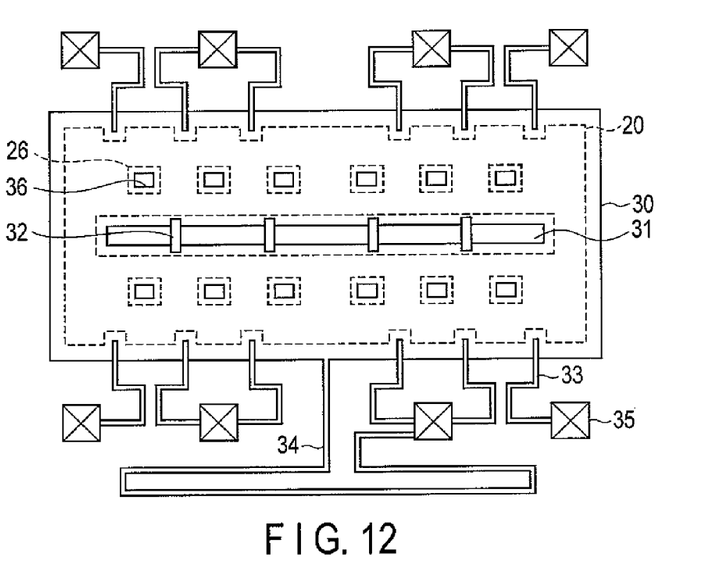
FIG. 12 is a further plan view schematically showing the configuration of the MEMS device according to a second embodiment.

As shown in FIG. 11, short slits 37 may be cut, each extending at right angles to slit 31. The short slits 37 are made in two parts of the upper electrode 30, which lie between the first spring parts 33 spaced apart in the lengthwise direction of the upper electrode 30. That is, slits 37 are made in the regions where the force applied from the spring parts 33 decreases at the time of pull-out. The pull-out voltage can therefore be raised more than otherwise. Further, as shown in FIG. 12, the lower electrode 20 may not be split into parts, or may remain a single member.

Figure 13:
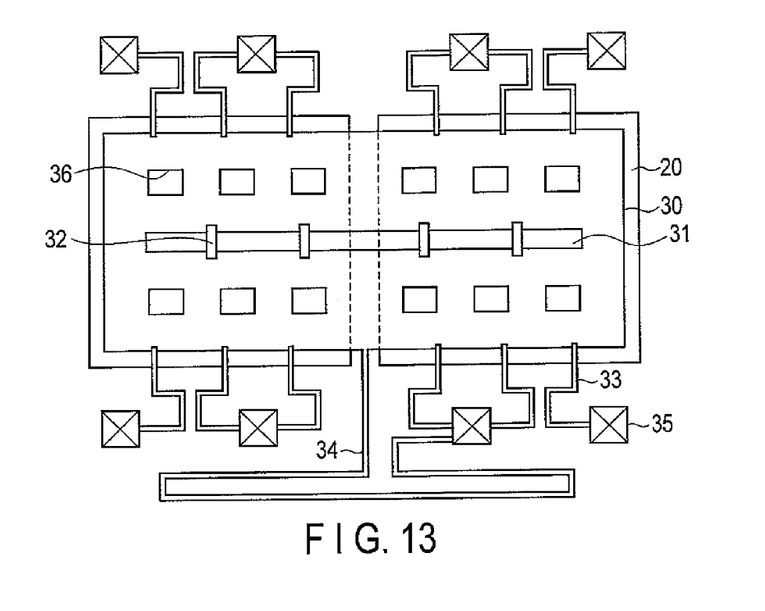
FIG. 13 is another plan view schematically showing the configuration of the MEMS device according to a second embodiment.
Figure 14:
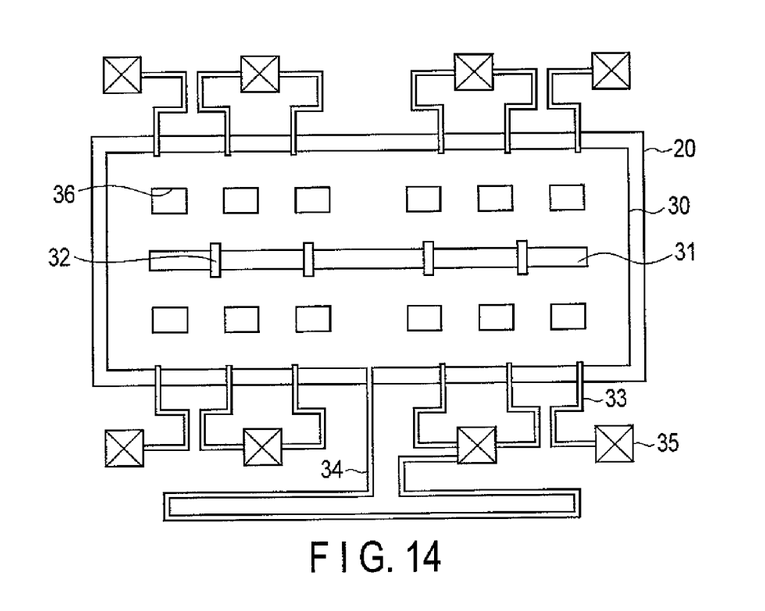
FIG. 14 is a further plan view schematically showing the configuration of the MEMS device according to a second embodiment.

Moreover, the lower electrode 20 may not have holes 26. FIG. 13 shows a device, in which the lower electrode 20 does not have holes 26 and is divided into two parts, i.e., left and right halves. FIG. 14 shows a device, in which the lower electrode 20 does not have holes 26 and is a single member, not divided into parts. Further, as shown in FIG. 13 and FIG. 14, the upper electrode 30 need not overlap the lower electrode 20. That is, the lower electrode 20 may have its edges extending outwards from the upper electrode 30, while electrodes 20 and 30 remains overlapping each other.

In any one of the devices shown in FIG. 9 to FIG. 10, the upper electrode 30 as a slit 31 and bridge parts 32, and the V-deformation is therefore suppressed at that part of the upper electrode 30, which has slit 31. Hence, the device can achieve an advantage similar to that of the first embodiment.

Modified Embodiments

The invention is not limited to the embodiments described above.

In any embodiment described above, beam parts are provided at only the two sides of the upper electrode, which oppose each other. Nonetheless, beam parts may be provided, as auxiliary beam parts, at any other side of the upper electrode.

The material of the bridge parts is not limited to silicon nitride film. The material may be changed, as needed, in accordance with the specification of the device. The bridge parts may be made of a material different from that of the upper electrode. In this case, the bridge parts receive a stress different form the stress the upper electrode receives. This can work well for pulling out the upper electrode 30. If the bridge parts are made of, for example, a material having a compressive stress smaller than the upper electrode, a force will be applied to bend upward, in a convex form, that part of electrode 30, which has slit 31. This force acts well, pulling out the upper electrode. Further, the bridge parts, which are made of a brittle material, scarcely undergo plastic deformation (change of shape), and can effectively suppress the deformation of the electrode. Still further, made of the same material as the first spring parts, the bridge parts can be formed in the same step as the first spring parts, facilitating the manufacture of the device. Moreover, the number of bridge parts can be changed, as needed, in accordance with the specification of the device.

Any embodiment described thus far is a MEMS capacitor used as element having variable capacity. The invention can be applied to a switching element for high-frequency use, too. Further, the support substrate is not limited to one comprising an Si substrate and a silicon oxide film formed on the support substrate, and may be an insulating substrate made of glass, instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A MEMS device comprising:
a first electrode provided on a support substrate;
a second electrode opposed to the first electrode and being movable in a direction in which the second electrode is opposed to the first electrode; and
beam parts connected to respective opposite sides of the second electrode, each of the beam parts supporting the second electrode,
wherein the second electrode comprises a slit extending parallel to the sides of the second electrode to which the beam parts are connected, the slit opening at both a front and a back of the second electrode,
wherein the second electrode further comprises at least one bridge part extending over the slit, the at least one bridge part crossing the slit, and wherein the at least one bridge part is made of a material different from a material of the second electrode, and both ends of the at least one bridge part are fixed on the second electrode.

2. The device according to claim 1, wherein the at least one bridge part is made of a material having one of (i) a larger compressive stress and (ii) a smaller tensile stress than the material of the second electrode.

3. The device according to claim 2, wherein the at least one bridge part is made of an insulating film.

4. The device according to claim 3, wherein the second electrode is made of one of aluminum and an aluminum alloy, and the at least one bridge part is made of a silicon nitride film.

5. The device according to claim 1, wherein the slit is provided in a center part of the second electrode.

6. The device according to claim 1, wherein the first and second electrodes constitute a switching element.

7. The device according to claim 1, wherein a capacitor insulating film is provided so as to cover the first electrode, and the first and second electrodes constitute a variable capacitor element.

8. The device according to claim 1, wherein the first electrode is split into a plurality of parts.

9. The device according to claim 1, wherein the support substrate comprises a silicon substrate and a silicon oxide film formed on the silicon substrate.

10. The device according to claim 1, wherein the support substrate has anchor parts, and each of the beam parts is connected at one end thereof to the second electrode, and at the other end thereof to the anchor parts.

11. A MEMS device comprising:
a first electrode provided on a support substrate;
a rectangular second electrode opposed to the first electrode and being movable in a direction in which the second electrode is opposed to the first electrode, the second electrode comprising a slit made in a center part thereof, and the slit opening at both a front and a back of the second electrode and extending in a lengthwise direction;
beam parts connected to longer sides of the second electrode which oppose to each other, each of the beam parts supporting the second electrode; and
bridge parts extending over and crossing the slit, the bridge parts being made of a material different from a material of the second electrode, and both ends of each of the bridge parts being fixed on the second electrode.

12. The device according to claim 11, wherein the bridge parts are made of a material having one of (i) a larger compressive stress and (ii) a smaller tensile stress than the material of the second electrode.

13. The device according to claim 12, wherein the bridge parts are made of an insulating film.

14. The device according to claim 13, wherein the second electrode is made of one of aluminum and an aluminum alloy, and the bridge parts are made of a silicon nitride film.

15. The device according to claim 11, wherein the first and second electrodes constitute a switching element.

16. The device according to claim 11, wherein a capacitor insulating film is provided so as to cover the first electrode, and the first and second electrodes constitute a variable capacitor element.

17. The device according to claim 11, wherein the first electrode is split into a plurality of parts.

18. The device according to claim 11, wherein the support substrate comprises a silicon substrate and a silicon oxide film formed on the silicon substrate.

19. The device according to claim 11, wherein the support substrate has anchor parts, and each of the beam parts is connected at one end thereof to the second electrode, and at the other end thereof to the anchor parts.

20. A method of manufacturing a MEMS device, the method comprising:
applying a material of a first electrode to a support substrate;
patterning the material of the first electrode, thereby forming the first electrode;
forming a sacrificial film on the first electrode;
applying a material of a second electrode to the first electrode;
patterning the material of the second electrode, thereby forming a second electrode, and making a slit extending parallel to two opposing sides of the second electrode, the slit opening at both a front and a back of the second electrode;
forming beam parts connected to the two opposing sides of the second electrode and bridge parts crossing the slit, before the material of the second electrode is patterned, such that both ends of each of the bridge parts are fixed on the second electrode; and
removing the sacrificial film after the material of the second electrode is patterned.

21. The device according to claim 1, wherein the slit is provided inside of the second electrode.

* * * * *